United States Patent [19]

Filliman

[11] Patent Number: 4,679,131
[45] Date of Patent: Jul. 7, 1987

[54] REGULATING POWER SUPPLY FOR VIDEO DISPLAY APPARATUS

[75] Inventor: Paul D. Filliman, Indianapolis, Ind.

[73] Assignee: RCA Corporation, Princteon, N.J.

[21] Appl. No.: 733,447

[22] Filed: May 10, 1985

[51] Int. Cl.$^4$ .......................................... H02M 3/335
[52] U.S. Cl. ........................................ 363/21; 363/97;
363/131; 323/288; 358/190; 315/411
[58] Field of Search ....................... 363/20, 21, 41, 97,
363/131; 323/288; 315/411; 358/190

[56] References Cited

U.S. PATENT DOCUMENTS

| | | | |
|---|---|---|---|
| 3,487,234 | 12/1969 | Morgan | 307/252 |
| 4,037,271 | 7/1977 | Keller | 363/21 |
| 4,276,586 | 6/1981 | Boekhorst | 363/21 |
| 4,302,803 | 11/1981 | Shelly | 363/20 |
| 4,316,242 | 2/1983 | Colangelo et al. | 363/21 |
| 4,347,559 | 8/1982 | Sturgeon | 363/21 |
| 4,353,112 | 10/1982 | Rietveld et al. | 363/16 |
| 4,385,264 | 5/1983 | Balaban et al. | 315/411 |
| 4,400,767 | 8/1983 | Fenter | 363/21 |
| 4,429,259 | 1/1984 | Luz | 358/190 X |
| 4,459,651 | 7/1984 | Fenter | 363/21 |
| 4,460,951 | 7/1984 | Fenter et al. | 363/49 |
| 4,489,369 | 12/1984 | Ginsberg | 363/21 |
| 4,559,592 | 12/1985 | Muller | 363/21 |

FOREIGN PATENT DOCUMENTS

| | | |
|---|---|---|
| 0091133 | 10/1983 | European Pat. Off. . |
| 1536408 | 12/1978 | United Kingdom . |
| 1535100 | 12/1978 | United Kingdom . |
| 2083665 | 3/1982 | United Kingdom . |
| 2156548 | 10/1985 | United Kingdom . |

*Primary Examiner*—Patrick R. Salce
*Assistant Examiner*—Emanuel Todd Voeltz
*Attorney, Agent, or Firm*—Paul J. Rasmussen; Joseph J. Laks; Scott J. Stevens

[57] ABSTRACT

A regulating power supply for a video display apparatus includes a switching transistor that periodically energizes a transformer winding. Input switching pulses for the transistor are varied in width and frequency to optimize power transfer via the transformer. The charge and discharge rates of a capacitor determine the pulse width and frequency. The capacitor charging current is selectively switched to be connected to the capacitor while the capacitor discharge current is controlled in response to a feedback signal derived from the regulated voltage level.

9 Claims, 3 Drawing Figures

REGULATING POWER SUPPLY FOR VIDEO DISPLAY APPARATUS

This invention relates to switching-type regulating power supplies for video display apparatus and, in particular, to switching-type supplies that operate in response to variable width and frequency pulses.

Video display apparatus, such as television receivers or computer monitors, incorporate power supplies that provide one or more regulated voltage levels that are used to power various load circuits of the video display apparatus. One such power supply utilizes a switching device, such as a transistor, that periodically energizes a primary winding of a transformer from an unregulated voltage source in response to trigger pulses. The trigger pulse width is controlled so that the transformer secondary winding develops a voltage that remains constant independent of load changes and variations in the unregulated voltage level.

Wide variations in load circuit power requirements, such as may occur with circuitry incorporated in video display apparatus, may cause the pulse width variations of the previously described pulse width modulation power supply to be quite large. Large pulse width variations may consequently result in large flux density variations in the transformer windings, thereby increasing the complexity of the circuit and transformer design. A power supply having a pulse frequency modulation regulator arrangement with a fixed pulse width simplifies transformer design and construction but may introduce other difficulties. For example, at very low load conditions, the pulses frequency may decrease into the audible range. At high load conditions insufficient power may be transferred to maintain voltage level regulation.

In accordance with an aspect of the present invention, a power supply for a video display apparatus comprises a source of unregulated voltage, a transformer winding and a switch for coupling the source of voltage to the winding in response to input pulses. A pulse generator comprises a source of current that produces a predetermined current level. A first current path that includes a capacitor is coupled to a second current path that includes a control circuit. Circuitry responsive to the voltage level across the capacitor couples the current source to the first and second current paths when the capacitor is discharged below a first voltage level and decouples the current source from the first and second current paths when the capacitor is charged above a second voltage level. Circuitry is coupled to the second current path control circuit and is responsive to a reference voltage for controlling the current flow through the second current path. The second current path in a first mode diverts current from the current source away from the capacitor to control the charging time of the capacitor and in a second mode discharges the capacitor. The control circuit controls the discharge time of the capacitor.

In the accompanying drawing.

Figure 1:
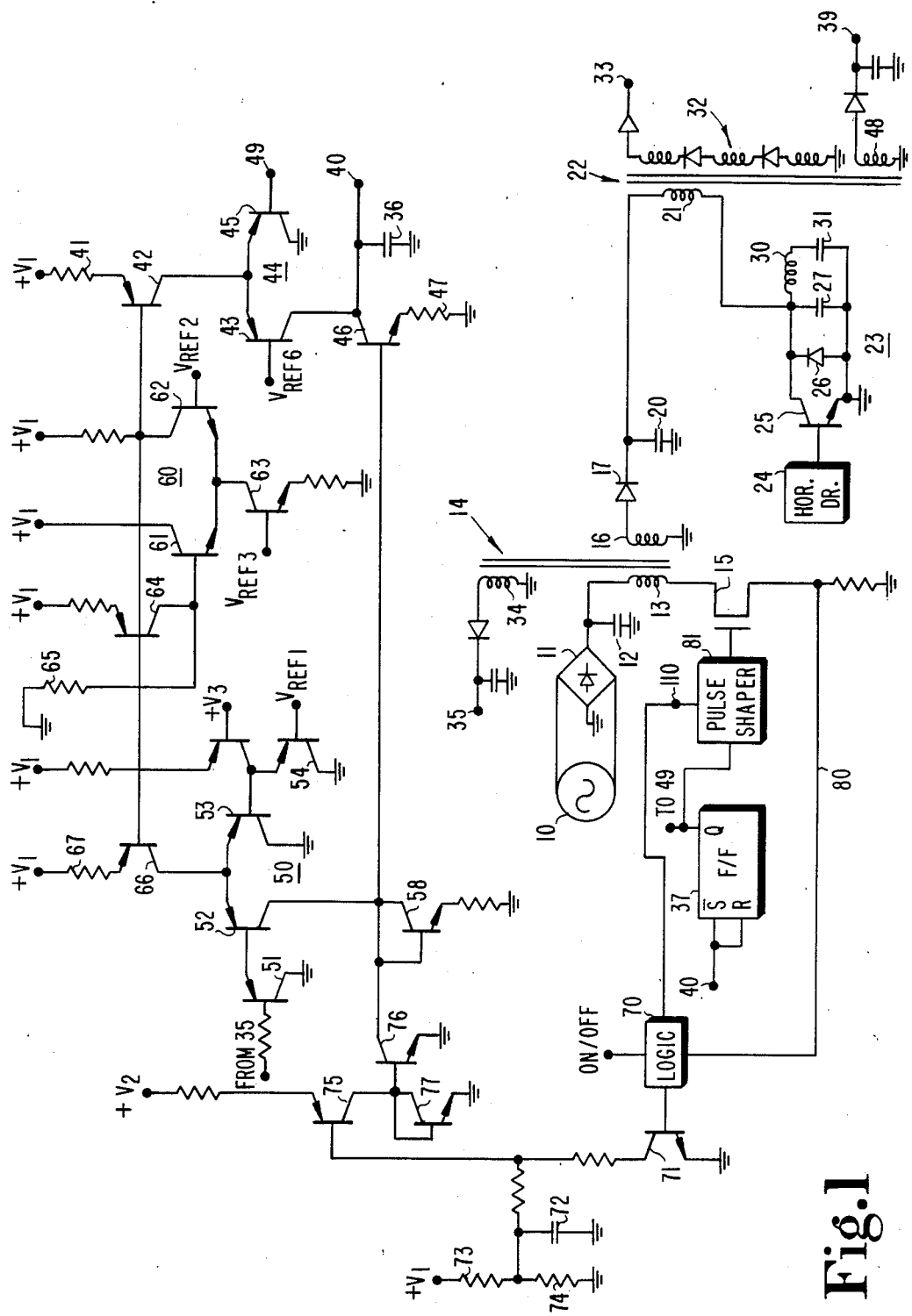
FIG. 1 is a schematic and block diagram of a portion of a video display apparatus incorporating a power supply in accordance with an aspect of the present invention.

Referring the FIG. 1, there is shown a portion of a video display apparatus, such as a television receiver or a computer monitor, in which an AC voltage from an AC line supply 10 is applied to a rectifying circuit 11 and a filter capacitor 12 to provide an unregulated DC voltage. The unregulated DC voltage is applied to one terminal of a primary winding 13 of a transformer 14. Transformer 14 may illustratively provide electrical isolation between the AC supply 10 and customer access terminals (not shown) such as audio and video input and output terminals. This isolation is provided by electrically isolating the video and audio load circuits, for example, from the supply 10 via transformer 14. The other terminal of winding 13 is coupled to the drain electrode of a MOSFET 15 which, in accordance with an aspect of the present invention, receives gate input pulses of varying width and frequency generated in a manner that will be described later. The gate input pulses cause MOSFET 15 to switch conduction states in a manner that generates a regulated voltage across secondary winding 16 of transformer 14. Additional secondary windings may be provided in order to generate other regulated voltage levels that may be used to power various load circuits of the video display apparatus. The voltage generated across a winding 34 is rectified and filtered to provide a voltage level at a terminal 35 that is indicative of the regulated voltage level produced by winding 16. The voltage at terminal 35 provides feedback to the pulse generator circuitry that controls the switching of MOSFET 15.

The voltage developed across winding 16 is rectified and filtered by diode 17 and capacitor 20, respectively, and is applied to one terminal of a primary winding 21 of a high voltage transformer 22. The other terminal of primary winding 21 is coupled to a conventional horizontal deflection circuit 23 which comprises a horizontal driver circuit 24 that supplies switching pulses to a horizontal output transistor 25. Horizontal deflection circuit 23 also comprises damper diode 26, retrace capacitor 27, horizontal deflection winding 30 and S-shaping capacitor 31. Horizontal deflection circuit 23 generates a deflection current in deflection winding 30 which is located about the neck of a cathode ray tube (not shown) in order to provide horizontal deflection of the cathode ray tube electron beams. Switching of horizontal output transistor 25 generates horizontal retrace pulses across winding 21 which are stepped up and rectified by high voltage winding 32 to produce a high voltage level of the order of 30,000 volts at an ultor terminal 33. The high voltage is applied to the ultor terminal (not shown) of the cathode ray tube. High voltage transformer may also comprise additional windings, such as winding 48, which may develop a voltage that is rectified and filtered to provide power to one or more of the video display apparatus via a terminal 39.

Figure 2:
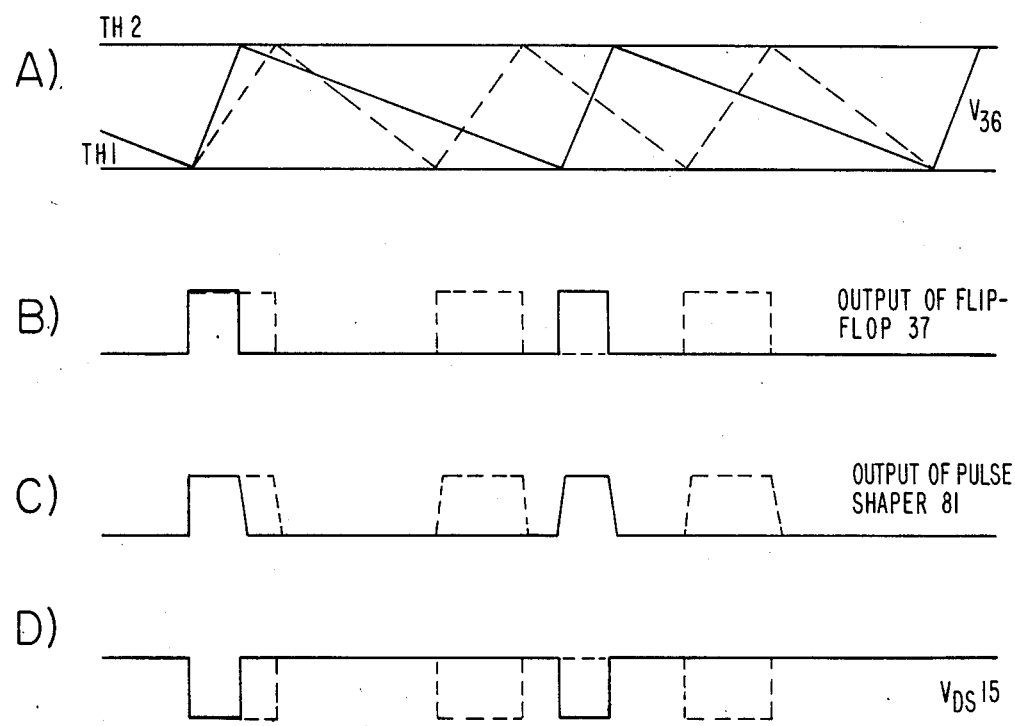
FIG. 2 illustrates waveforms useful in understanding the circuit of FIG. 1.

The generation of input pulses for MOSFET 15 occur in the following manner. The pulses generated are caused to vary in both pulse width and frequency. The allowable variation in pulse width is less than the corresponding variation in a fixed frequency pulse width modulated power supply since the pulse frequency can also vary. In the illustrative circuit of FIG. 1, during normal operation, the pulse width is constrained to vary only within a range of the order of 4μS to 8μS while the pulse frequency may vary in a range of the order of 5 KHz to 80 KHz. The charge and discharge rates of a capacitor 36, shown by the solid waveform in FIG. 2A, determine the pulse width and frequency. The charging time of capacitor 36 between two threshold values TH1 and TH2 determines the pulse width while the discharge time of capacitor 36 between the threshold values TH2 and TH1 determines the time between pulses, which is equal to pulse frequency. The threshold values TH1 and TH2 are set by flip-flop circuit 37, which may be of a R-S type designed to switch at threshold values which are at $\frac{1}{3}$ and $\frac{2}{3}$ of the supply voltage. The voltage developed across capacitor 36, present at terminal 40, is applied to the $\bar{S}$ and R inputs of flip-flop 37. The Q and output of flip-flop 37, under control of the voltage levels at terminal 40, switches in response to capacitor 36 attaining respective threshold levels during charging or discharging. The Q output of flip-flop 37, which produces a signal such as that shown by the solid waveform in FIG. 2B, is applied to a pulse shaping circuit 81. The output of pulse shaping circuit 81, shown by the solid waveform in FIG. 2C, is applied to the gate of MOSFET 15.

Capacitor 36 is charged from the $+V_1$ supply via a charging path comprising resistor 41, transistor 42 and transistor 43 of differential amplifier 44. The input to the gate of transistor 43 is connected to a voltage reference source $V_{REF6}$ which is equal to one-half the logic swing of flip-flop 37, i.e., one-half the voltage swing of the Q output. The gate of transistor 45 of differential amplifier 44 is coupled to the Q output of flip-flop 37. The discharge path of capacitor 36 comprises transistor 46 and resistor 47. The charging current through resistor 41 and transistor 42 represents a known current level determined in a manner that will be explained later. This current is conducted by either transistor 43 or transistor 45, determined by the level state of the input terminal 49 of transistor 45, which is the Q output of flip-flop 37. The degree of conduction of transistor 46 will determine the charge and discharge rates of capacitor 36. While transistor 43 is conducting, transistor 46 will divert charging current from capacitor 36, thereby increasing the charging time. The maximum current diverted by transistor 46 is established, in a manner to be described, to be one-half the charging current, such that capacitor 36 will continue to charge as long as transistor 43 is conducting. when transistor 43 is not conducting, conduction of transistor 46 will cause capacitor 36 to discharge. Therefore, the degree of conduction (i.e., current flow) of transistor 46 will determine both the charging and discharging rates of capacitor 36 and hence both the pulse width and frequency produced by the pulse generator. The voltage level at the base of transistor 46, which controls the degree of conduction of transistor 46, is determined by a differential amplifier 50, essentially comprising transistors 51, 52, 53 and 54 and a current source transistor 66. The input of transistor 54, one input of differential amplifier 50, is derived from a carefully controlled reference voltage $V_{REF1}$. The other input of differential amplifier 50, transistor 51, receives a regulator feedback signal from terminal 35 that is derived from the voltage developed across sense winding 34, which, in turn, is derived from the regulated voltage produced by transformer 14. As the feedback voltage decreases with respect to $V_{REF1}$, indicating a drop in the regulated voltage level, transistor 52 turns on harder which, via diode-connected transistor 58, raises the base voltage of transistor 46 which causes transistor 46 to also turn on harder, thereby increasing conduction. This results in capacitor 36 charging at a slower rate, as shown by the dashed waveform in FIG. 2A, thereby increasing the MOSFET input pulse width, shown by the dashed waveform in FIG. 2C, when the charging current is switched to flow via transistor 43. When the charging current is switched to flow via transistor 45, increased conduction of transistor 46 will cause capacitor 36 to discharge at a faster rate, thereby increasing the MOSFET input pulse frequency as can also be seen in FIG. 2C. MOSFET 15 will therefore conduct longer and more frequently, as shown by the dashed waveform in FIG. 2D, causing the regulated voltage level to rise. Conversely, a rise in regulated voltage level will cause an increase in the voltage applied to transistor 51, causing it to conduct less, which causes transistors 52 and 46 to conduct less, thereby decreasing the pulse width and frequency so that the regulated voltage decreases. The circuit operates in this manner by simultaneously varying the pulse width and frequency to maintain the regulated voltage at a constant level.

As previously described, the charging current supplied via transistor 42 and transistor 43 is a known value, with the maximum discharge current flow via transistor 46 referenced to the charging current in the following manner. Differential amplifier 60, comprising transistors 61, 62 and 63, has one input, the base of transistor 62, coupled to a reference voltage $V_{REF2}$. Conduction of transistor 62 causes its collector voltage to drop, thereby turning on transistor 64 harder, since transistor 64 has its base connected to the collector of transistor 62. Increased conduction of transistor 64 increases the current flow through resistor 65, which increases the voltage drop across resistor 65, thereby raising the base voltage of transistor 61, turning it on harder. Increased conduction of transistor 61 decreases the conduction of transistor 62 so that conduction of transistor 64 and consequently transistor 61 is decreased. In this feedback manner the voltage at the base of transistor 61 is maintained substantially equal to the voltage at the base of transistor 62, which is equal to $V_{REF2}$. Since the collector voltage of transistor 64 is known, selecting the desired value of resistor 65 determines the current flow via transistor 64. The base of transistor 64 is also coupled to the bases of transistors 42 and 66, so that their current flow is also known. Transistor 42 conducts the charging current via resistor 41 while transistor 66 controls the discharge current of transistor 46 via a resistor 67. Therefore, the ratio of values of resistors 41 and 67 will determine the maximum ratio of charge current to discharge current. Illustratively, the charge current is selected to be twice the discharge current at maximum conduction of transistor 52. Under those conditions, this results in an equal current charging and discharging capacitor 36, thereby providing MOSFET input pulses having a 50% duty cycle, which is desirable for optimum power transfer.

During startup operation of the power supply when the video display apparatus is energized, for example, it is desirable to limit the generated pulse width and frequency to allow the circuit supply voltages to increase to their normal levels without undue loading. A slow start circuit is provided which allows the pulse width and frequency to increase slowly. When the video display apparatus is turned off, logic circuitry 70 causes transistor 71 to momentarily conduct, thereby discharging capacitor 72. When the video display apparatus is energized, capacitor 72 will be discharged but will begin charging from the slowly increasing supply $+V_1$ via resistor 73, which forms a voltage divider with resistor 74. With capacitor 72 discharged, the voltage level at the base of transistor 75 will cause it to turn on, thereby turning on transistor 76 via diode-connected transistor 77. Transistor 76 will divert or conduct the discharge control current from transistor 52, so that the generated MOSFET input pulses have narrow widths and low frequency. As the operating supply $+V_1$ increases, the voltage developed across capacitor 72 will cause a decrease in conduction of transistor 75, and hence a decrease in conduction of transistor 76. The discharge control current will then begin to control the base voltage of transistor 46, so that the generated pulses become wider and more frequent. When the operating supply $+V_1$ substantially reaches its normal level, the voltage across capacitor 72 will cause transistors 75 and 76 to turn off, thereby ending the slow start interval and permitting the pulse generator to operate in its normal manner.

Logic circuit 70 may also be utilized to disable the power supply, and hence the video display apparatus, under certain fault conditions. For example, conductor 80 provides an overcurrent sensing signal to logic circuit 70 from MOSFET 15. In the event of an overcurrent condition, logic circuit 70 causes transistor 71 to conduct, which discharges capacitor 72. This causes conduction of transistor 76 which effectively disables the power supply. Logic circuit 70 may maintain transistor 71 in conduction as long as the overcurrent condition exists. Other fault conditions may also cause logic circuit 70 to operate in a similar manner such that the video display apparatus is prevented from operating during fault conditions.

Figure 3:
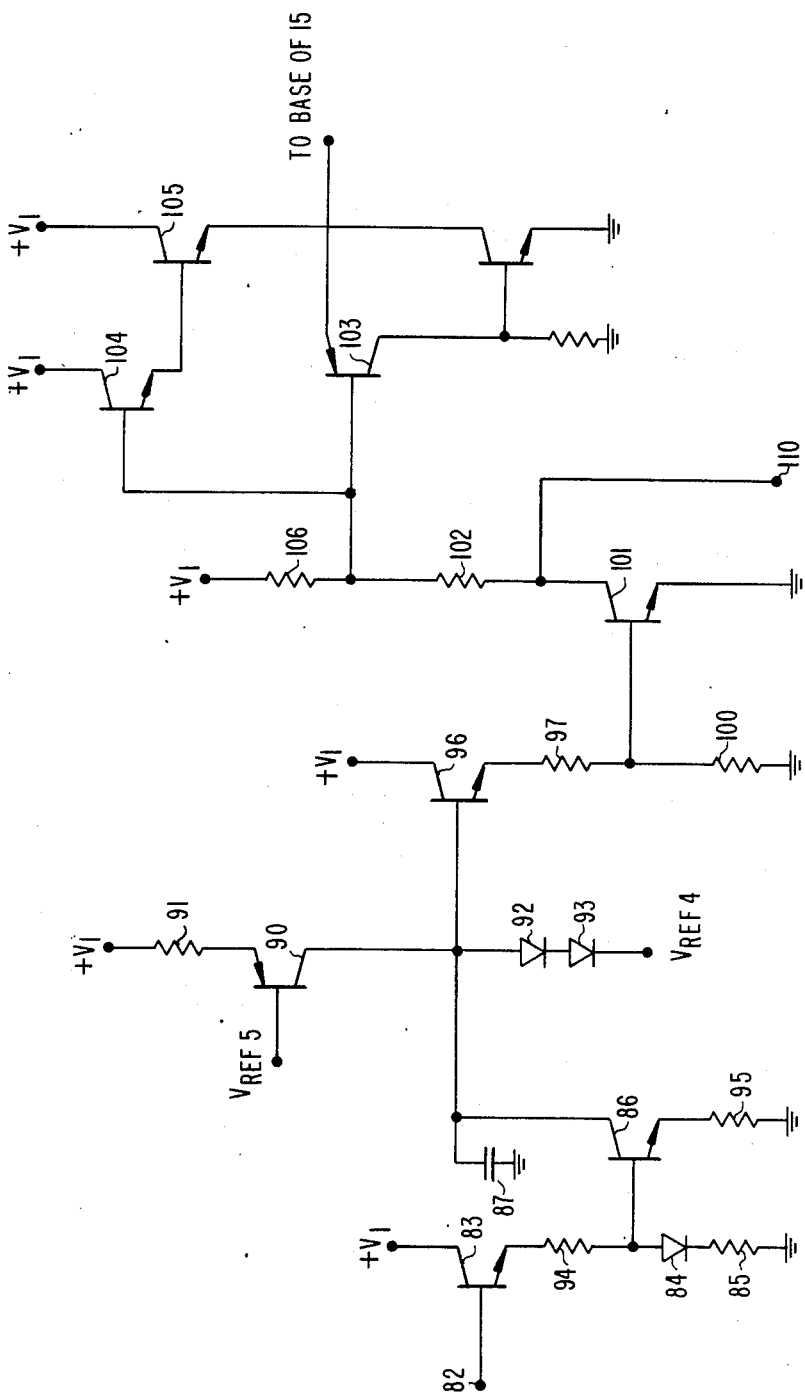
FIG. 3 is a schematic diagram of an embodiment of a pulse shaping circuit shown in FIG. 1.

The output of flip-flop 37, shown in FIG. 2B, is a square wave pulse corresponding to the desired switching signal for MOSFET 15. In order to reduce possible radio frequency interference (rfi) problems that may be caused by providing a sharp-edged pulse to MOSFET 15, pulse shaping circuit 81 is provided which processes the output signal of flip-flop 37 to generate a signal comprising pulses having controlled rise and fall times, as shown in FIG. 2C. One embodiment of pulse shaping circuit 81 is shown in FIG. 3. The output signal, from the Q output, of flip-flop 37 is applied to terminal 82, which is the base of transistor 83. The positive-going pulses from flip-flop 37 turn transistor 83 on which, via current flow through diode 84 and resistor 85, raises the base voltage of transistor 86, turning it on. Conduction of transistor 86 discharges capacitor 87 which is ordinarily charged from a constant current source comprising transistor 90 and resistor 91. Diodes 92 and 93 clamp the level to which capacitor 87 can charge. the discharge rate of capacitor 87 is determined by the values of resistor 85 and resistors 94 and 95. Discharge of capacitor 87 causes the base voltage of transistor 96 to decrease, thereby decreasing its conduction and causing the current through resistors 97 and 100 to decrease. As the voltage across resistor 100 decreases, conduction of transistor 101 decreases resulting in a linear rise in the voltage across resistors 102 and 106. The rise in voltage is linear because a relatively small portion of the RC charging voltage characteristic of capacitor 87 is amplified by transistor 96 and 101. The emitter voltage of transistor 103 also rises linearly to a level equal to the level of the $+V_1$ supply less the base emitter drops of transistors 104 and 105. The emitter of transistor 103 is coupled to the base of MOSFET 15 and provides the actual switching pulses for MOSFET 15.

The negative going edges of the pulses from flip-flop 37 turn transistors 83 and 86 off. Capacitor 87 then charges from the $+V_1$ supply via resistor 91 and transistor 90. This causes conduction of transistors 96 and 101 to increase, resulting in a linear decrease in voltage across resistor 102. Conduction of transistor 103 increases, so that the emitter voltage, and hence the MOSFET input pulse, linearly falls. The selection of values for resistors 85 and 95 determines the pulse rise time, while the selection of resistor 91 determines the pulse fall time.

Logic circuit 70 illustratively provides a signal to terminal 110 of pulse shaping circuit 81 during an overcurrent condition such that MOSFET 15 remains turned off, thereby providing further disabling of the power supply. As shown in FIG. 3, terminal 110 is connected to the collector of transistor 101.

What is claimed is:

1. A power supply for a video display apparatus comprising:
   a source of unregulated voltage;
   a transformer winding;
   switch means for coupling said source of unregulated voltage to said transformer winding in response to input pulses; and
   a pulse generator coupled to said switch means comprising:
      a source of current providing a predetermined current level;
      a first current path including a capacitor;
      a second current path coupled to said first current path;
      means, responsive to the voltage level across said capacitor, for coupling said source of current to said first and second current paths when said capacitor is discharged below a first predetermined voltage level for charging said capacitor and for uncoupling said source of current from said first and second current paths when said capacitor is charged above a second predetermined voltage level; and means responsive to a reference voltage level for controlling the amount of current flow through said second current path, in order to divert a controlled amount of charging current away from said capacitor when said source of current is coupled to said first and second current paths, for controlling the charging time of said capacitor, said second current path discharging said capacitor when said source of current is uncoupled from said first and second current paths, said control means controlling the discharge time of said capacitor.

2. A power supply for a video display apparatus comprising:
   a source of unregulated voltage;
   a transformer winding;
   switch means for coupling said source of unregulated voltage to said transformer winding in response to input pulses for providing an output voltage thereby; and
   a pulse generator coupled to said switch means comprising:
      a source of current providing a predetermined current level;
      a first current path including a capacitor coupled to said source of current;
      a second current path for diverting a controllable amount of charging current from said first current path during charging of said capacitor; and control means coupled to said second current path for controlling the magnitude of current flowing therein.

3. A power supply for a video display apparatus comprising:
   a source of unregulated voltage;
   a transformer winding;
   switch means for coupling said source of unregulated voltage to said transformer winding in response to input pulses; and
   a pulse generator coupled to said switch means comprising:
      a capacitor;
      a discharge current path coupled to said capacitor for providing a discharge path for said capacitor; and
      a charge current path incorporating a source of charging current selectively coupled to said capacitor for providing a charging path for said capacitor, a controlled portion of said charging current being diverted via said discharge current path, wherein said current being diverted is less than said current supplied by said source of current.

4. A power supply for a video display apparatus comprising:
   a source of unregulated voltage;
   a transformer winding;
   switch means for coupling said source of unregulated voltage to said transformer winding in response to input pulses; and
   a pulse generator coupled to said switch means comprising:
      a source of current providing a predetermined current level;
      a first current path including a capacitor; second current path coupled to said first current path;
      means, responsive to the voltage level across said capacitor, for coupling said source of current to said first and second current paths when said capacitor is discharged below a first predetermined voltage level for charging said capacitor and for uncoupling said source of current from said first and second current paths when said capacitor is charged above a second predetermined voltage level; and means responsive to a reference voltage level for controlling the amount of current flow through said second current path, in order to divert a controlled amount of charging current away from said capacitor when said source of current is coupled to said first and second current paths, for controlling the charging time of said capacitor, said second current path discharging said capacitor when said source of current is uncoupled from said first and second current paths, said control means controlling the discharge time of said capacitor, wherein said first current path comprises a first portion of a differential amplifier and wherein said means for coupling and uncoupling said source of current comprises a second portion of said differential amplifier and switch means responsive to said voltage level across said capacitor for providing an output signal to said second portion of said differential amplifier for coupling and uncoupling said source of current.

5. A power supply for a video display apparatus comprising:
   a source of unregulated voltage;
   a transformer winding;
   switch means for coupling said source of unregulated voltage to said transformer winding in response to input pulses; and
   a pulse generator coupled to said switch means comprising:
      a source of current providing a predetermined current level;
      a first current path including a capacitor;
      a second current path coupled to said first current path;
      means, responsive to the voltage level across said capacitor, for coupling said source of current to said first and second current paths when said capacitor is discharged below a first predetermined voltage level for charging said capacitor and for uncoupling said source of current from said first and second current paths when said capacitor is charged above a second predetermined voltage level; and means responsive to a reference voltage level for controlling the amount of current flow through said second current path, in order to divert a controlled amount of charging current away from said capacitor when said source of current is coupled to said first and second current paths, for controlling the charging time of said capacitor, said second current path discharging said capacitor when said source of current is uncoupled from said first and second current paths, said control means controlling the discharge time of said capacitor, wherein said first current path comprises a first portion of a differential amplifier and wherein said means for coupling and uncoupling said source of current comprises a second portion of said differential amplifier and switch means responsive to said voltage level across said capacitor for providing an output signal to said second portion of said differential amplifier for coupling and uncoupling said source of current, and wherein said switch means comprises a flip-flop.

6. A power supply for a video display apparatus comprising:
   a source of unregulated voltage;
   a transformer winding;
   switch means for coupling said source of unregulated voltage to said transformer winding in response to input pulses; and a pulse generator coupled to said switch means comprising:
      a source of current providing a predetermined current level;
      a first current path including a capacitor; a second current path coupled to said first current path;
      means, responsive to the voltage level across said capacitor, for coupling said source of current to said first and second current paths when said capacitor is discharged below a first predetermined voltage level for charging said capacitor and for uncoupling said source of current from said first and second current paths when said capacitor is charged above a second predetermined voltage level; and
      means responsive to a reference voltage level for controlling the amount of current flow through said second current path, in order to divert a controlled amount of charging current away from said capacitor when said source of current is coupled to said first and second current paths, for controlling the charging time of said capacitor, said second current path discharging said capacitor when said source of current is uncoupled from said first and second current paths, said control means controlling the discharge time of said capacitor, further comprising means for modifying the operation of said control means for controlling the amount of current flowing in said second current path during start up of said power supply.

7. The arrangement defined in claim 2, wherein said second current path also provides a discharge path for said capacitor.

8. The arrangement defined in claim 7, wherein said control means is responsive to said output voltage for controlling the rate of charging and the rate of discharging of said capacitor in order to regulate said output voltage.

9. The arrangement defined in claim 3, further comprising current control means coupled to said discharge current path for controlling the magnitude of said charging current being diverted.

* * * * *